US012580036B2

(12) United States Patent
Fujiwara et al.

(10) Patent No.: US 12,580,036 B2
(45) Date of Patent: Mar. 17, 2026

(54) APPARATUSES AND METHODS FOR FORCING MEMORY CELL FAILURES IN A MEMORY DEVICE

(71) Applicant: MICRON TECHNOLOGY, INC., Boise, ID (US)

(72) Inventors: Yoshinori Fujiwara, Boise, ID (US); Kenji Yoshida, Chofu (JP)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 18/667,358

(22) Filed: May 17, 2024

(65) Prior Publication Data

US 2024/0395349 A1     Nov. 28, 2024

Related U.S. Application Data

(60) Provisional application No. 63/503,674, filed on May 22, 2023.

(51) Int. Cl.
| | |
|---|---|
| *G11C 29/24* | (2006.01) |
| *G11C 29/00* | (2006.01) |
| *G11C 29/46* | (2006.01) |

(52) U.S. Cl.
CPC .............. *G11C 29/46* (2013.01); *G11C 29/24* (2013.01); *G11C 29/789* (2013.01)

(58) Field of Classification Search
CPC ....... G11C 29/46; G11C 29/24; G11C 29/789; G11C 2029/1202; G11C 2029/1204; G11C 29/76; G11C 29/787
See application file for complete search history.

(56) References Cited

U.S. PATENT DOCUMENTS

| | | | | |
|---|---|---|---|---|
| 2014/0198593 A1* | 7/2014 | Kwon | .................. | G11C 29/802 |
| | | | | 365/200 |
| 2024/0290414 A1* | 8/2024 | Kim | ........................ | G11C 29/02 |
| 2025/0157566 A1* | 5/2025 | Park | ........................ | G11C 29/76 |

* cited by examiner

*Primary Examiner* — Mohammed A Bashar
(74) *Attorney, Agent, or Firm* — Dorsey & Whitney LLP

(57) ABSTRACT

Apparatuses and methods for forcing memory cell failures in a memory device are disclosed. An example apparatus includes a column disable control circuit coupled to a plurality of column latch sets to receive match signals and associated column plane addresses, the column disable control circuit configured to provide redundant column select signals and column plane masking signals based on the match signals and associated column plane addresses, the column disable control circuit further configured to provide the redundant column select signal and the column plane masking signal corresponding to an active match signal and associated column plane address from a designated column latch set when a disable memory test mode is enabled to cause one or more memory cells of main memory to fail.

21 Claims, 9 Drawing Sheets

APPARATUSES AND METHODS FOR FORCING MEMORY CELL FAILURES IN A MEMORY DEVICE

CROSS-REFERENCE TO RELATED APPLICATIONS

This application claims the filing benefit of U.S. Provisional Application No. 63/503,674, filed May 22, 2023. This application is incorporated by reference herein in its entirety and for all purposes.

BACKGROUND

Dynamic random access memory (DRAM) are semiconductor memory devices that are used to store information. Information may be stored in memory cells, which may be organized into rows (word lines) and columns (bit lines) in a memory array. At various points in manufacturing and use of a memory device, one or more memory cells may fail (e.g., become unable to store information, be inaccessible by the memory device, etc.) and may need to be repaired.

The memory device may perform repair operations on a row-by-row and/or a column-by-column basis. A row containing a failed memory cell (which may be referred to as a defective row, a bad row, or a faulty row) may be identified during testing. The memory device may contain additional rows of memory (which may also be referred to as redundant rows) that may be used in repair operations. During a repair operation, a row address associated with the defective row may be redirected, such that the row address points to a redundant row instead. Similarly, a column containing a failed memory cell (which may be referred to as a defective column, a bad column, or a faulty column) may be identified. The memory device may contain additional columns of memory (which may also be referred to as redundant columns) that may be used in repair operations. During a repair operation, a column address associated with the defective column may be redirected, such that the column address points to a redundant column instead.

It may be desirable to test the capability of the memory to detect and repair defective rows, without relying on the memory including an actual failed row and/or column.

DETAILED DESCRIPTION

Figure 1:
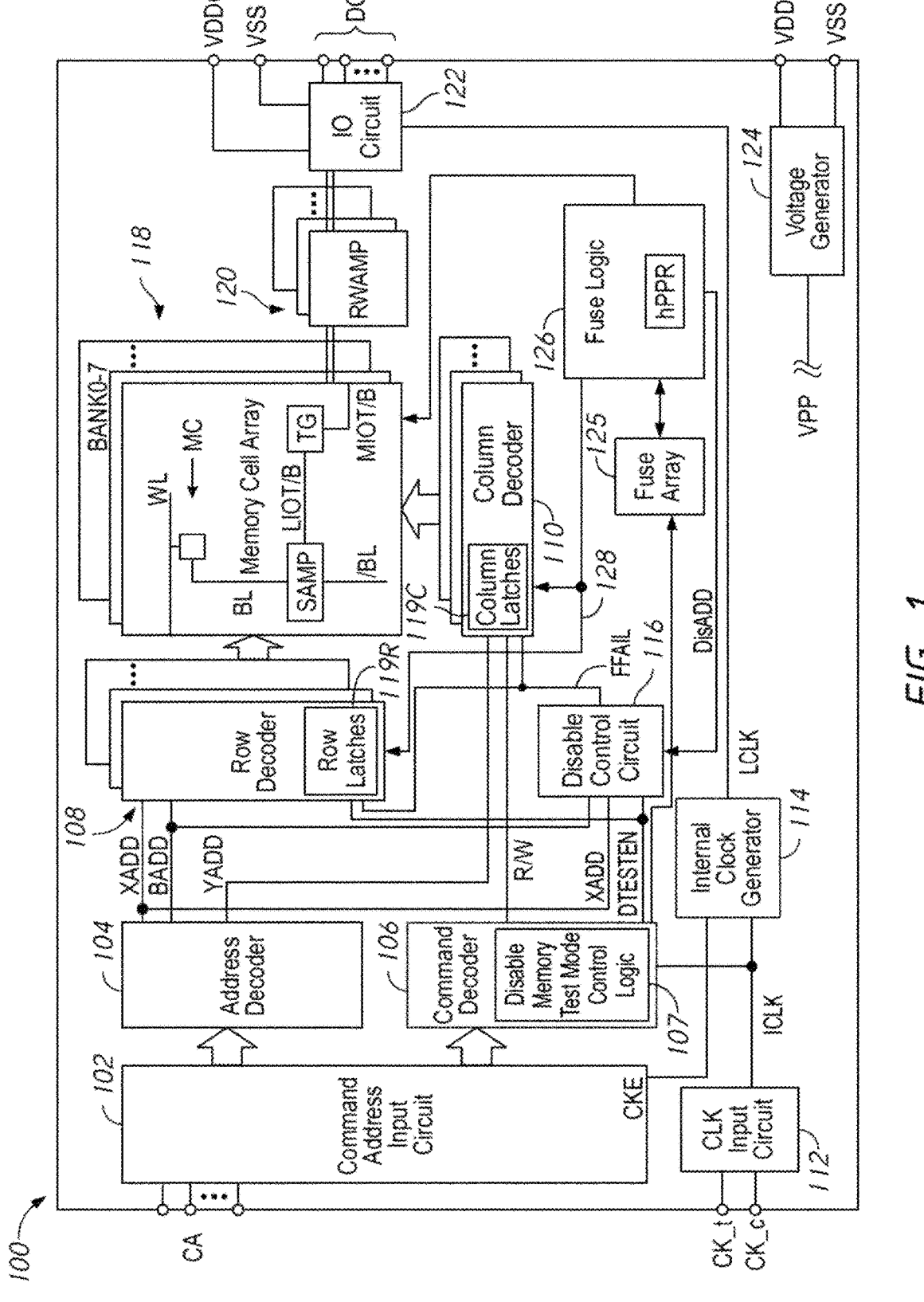
FIG. 1 is a block diagram of a semiconductor device according to at least some embodiment of the disclosure.

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column).

Certain memory cells may be defective, and rows containing the defective memory cells may generally be referred to as defective rows (or bad rows or faulty rows). The defective rows may be incapable of storing information and/or may become otherwise inaccessible to the memory device. In some cases, memory may become defective (and/or may be identified as defective) after the memory device is packaged (e.g., sealed in a chip package). The memory device may carry out one or more types of post-package repair (PPR) operations to resolve the defective rows. For example in a "hard" PPR operation (hPPR), fuses may be blown to permanently reprogram the logical row address so that it is associated with a new physical address (e.g., a redundant row instead of the original defective row). It may be useful to be able to test the controller's ability to detect and repair defective rows (and/or the memory's ability if internal testing circuits are used). However, it may be inefficient to wait for the memory to develop an error.

The present disclosure is generally directed to apparatuses, systems, and methods for forcing failures in a memory device. The memory includes various failure modes, which when activated, can be used to cause failures to occur in the memory array. The controller and/or memory may then detect the disabled memory and repair it (e.g., using an hPPR operation). The memory may be tested to determine if the repair was properly made. For example, a controller may enter a memory device into an failure mode and provide a disable address (and/or the memory may generate the disable address). When the memory receives an access address (e.g., as part of a read operation) which matches the disable address, a disable control circuit of the memory may cause the read operation to fail for the memory associated with the disable address (as long as the disable address has not been already repaired). When a disable memory test mode is enabled, the memory may alter the access operation to force the failure. For example, the memory may suppress internal control signals (e.g., ACT, COL, and/or CS, etc.), block data from a data path, may change one or more of the read bits (e.g., by inverting the bits, by replacing the bits, by randomizing the bits, etc.), or combinations thereof.

FIG. 1 is a block diagram of a semiconductor device according to at least some embodiment of the disclosure. The semiconductor device 100 may be a semiconductor memory device, such as a dynamic random access memory (DRAM) device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL.

The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or/BL.

The device also includes a fuse array 125, which contains a plurality of non-volatile storage elements (fuses) which may store information about addresses in the memory array 118. The fuse array may include a variety of non-volatile elements such as fuses and anti-fuses, which are referred to generically as fuses herein. Each fuse may start in a first state (e.g., an anti-fuse may be insulating), and may be 'blown' to permanently change the fuse's state (e.g., a blown anti-fuse may be conductive). Each fuse may be considered to be a bit, which is in one state before it is blown, and permanently in a second state after it's blown. For example, a fuse may represent a logical low before it is blown and a logical high after it is blown.

Specific groups of fuses may be represented by a fuse bank address FBA, which may specify the physical location of each of the fuses in the group within the fuse array 125. The group of fuses associated with a particular FBA may act as a row repair element (RRE) or a column repair element (CRE). The RRE may be encoded with a row address to be repaired (e.g., by blowing fusing to encode a binary string of the row address). The RRE may be associated with a particular redundant row of the memory array 118. Similarly, the CRE may be encoded with a column address to be repaired and associated with a particular redundant column of the memory array 118.

The address information in the fuse array 125 may be 'scanned' out along a fuse bus to row latches 119R and column latches 119C. Each row latch 119R may be associated with a particular wordline of the memory array 118 and each column latch 119C may be associated with a particular column of the memory array 118. The address stored in a given RRE may be scanned out from the fuse array 125 along the fuse bus 128, and may be latched by a particular row latch 119R. Similarly, the address stored in a given CRE may be scanned out from the fuse array 125 along the fuse bus 128, and may be latched by a particular column latch 119C. Although not shown in FIG. 1, the fuse bus 128 may be additionally coupled to other circuits of the semiconductor device 100 to provide other fuse information, for example, for trimming internal timing circuits and voltage circuits. Thus, the fuse bus 128 is not limited to providing information from the fuse array 125 to the row and column latches 119R and 119C. Each row latch 119R may act as a redundant row decoder and may compare the row address XADD to the stored address from the fuse bus. When there is a match, the redundant row may be accessed. In this manner, an address stored as an RRE in the fuse array 125 may be associated with a particular row of the memory array 118. The address stored in the row latch 119R may then direct access commands to the wordlines associated with the row latch 119R. Each column latch 119C may act as a redundant column decoder and may compare the column address YADD to the stored address from the fuse bus. When there is a match, the redundant column may be accessed. In this manner, an address stored as an CRE in the fuse array 125 may be associated with a particular row of the memory array 118. The address stored in the column latch 119C may then direct access commands to the wordlines associated with the column latch 119C.

The fuse array 125 may be divided into different sections. For example, each bank of the memory array 118 may be associated with a fuse bank of the fuse array 125, which may store information related to that memory bank. Each fuse bank may have a number of RREs and CREs based on a number of repair operations (e.g., a number of redundant rows and a number of redundant columns) which are associated with that memory bank.

The memory device 100 includes a repair logic circuit 126. The repair logic circuit 126 may include post package repair (PPR) circuits (e.g., hard PPR or hPPR circuits) which may be used to make changes to the fuse array 125. For example, the hPPR circuits may perform a hard repair, where fuses in an RRE of the fuse array 125 are blown to 'repair' a row by encoding the repaired row address permanently into the RRE or fuses in a CRE of the fuse array 125 are blown to repair a column by encoding the repaired column address permanently into the CRE. Soft PPR circuits (sPPR circuits) and volatile memory elements which may be used to make non-permanent repairs may be included in row decoder 108. The row decoder 108 may monitor the data along the fuse bus 128 and may selectively alter the data based on the data stored in the volatile storage elements. For example, the sPPR circuits may scan the fuse array 125 to locate an open RRE or CRE, and then when the fuse information is streamed to the row latches 119R, the sPPR circuits may alter the data along the fuse bus so that the address stored in the volatile latches of the sPPR circuit are provided along the fuse bus to the row latches 119R.

The memory device 100 includes a disable control circuit 116. The disable control circuit 116 may be used as part of a test operation. For example, the disable control circuit 116 may disable a selected row address (e.g., a bad row address or disable address) of the memory array 118 to prevent proper access operations (e.g., read operations) from being performed on that row address until it is repaired. Additionally, the disable control circuit 116 may disable a selected column address (e.g., a bad column address or disable address) of the memory array 118 to prevent proper access operations from being performed on that column address until it is repaired. The disable control circuit 116 may be activated when a disable memory test mode of the memory 100 is enabled. Various methods may be used to enter the memory 100 into a disable memory test mode. For example, a fuse setting, a command from a controller (e.g., a multi-purpose command), a mode register setting, or combination thereof.

When a disable memory test mode is enabled, the disable control circuit 116 may compare addresses XADD and YADD to a selected bad row address and a selected bad column address. The bad row address and the bad column address may be provided by a controller, or may be generated on the memory 100. For example, the memory 100 may pre-set the bad row address and/or the bad column address, may randomly generate the bad row and/or column address or combinations thereof. When the address XADD matches the stored bad row address (and a failure mode is active, and the row address XADD has not been previously repaired) the disable control circuit 116 provides a signal FFAIL at an active level. Similarly, when the address YADD matches the stored bad column address (and a failure mode is active, and the column address YADD has not been previously repaired) the disable control circuit 116 provides a signal FFAIL at the active level.

Responsive to the signal FFAIL being active, the row decoder 108 and/or column decoder 110 may prevent data from being properly read from the memory array 118. For example, responsive to the signal FFAIL being active, an internal control signal necessary for a proper read operation may be suppressed, data may be blocked from a data path, the bits read from the memory array may be altered (e.g., set to a single value, randomized, inverted, etc.) or combinations thereof. If the repair logic 126 indicates that the selected bad row address or bad column address has been repaired, then the signal FFAIL may be suppressed to allow for proper access of the redundant word line or redundant column now associated with the address XADD or YADD.

In some embodiments, the disable control circuit 116 may share components and/or logic with the repair logic 126. For example, the disable address may be stored in the fuse array, and the hPPR logic may be used.

The semiconductor device 100 may employ a plurality of external terminals that include command and address (C/A) terminals coupled to a command and address bus to receive commands and addresses, clock terminals to receive clocks CK and/CK, data terminals DQ to provide data, and power supply terminals to receive power supply potentials VDD, VPP, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line. The command decoder 106 may include disable memory test mode control logic 107 that provides disable memory test enable signals DTESTEN to the disable control circuit 116.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The power supply terminals are supplied with power supply potentials VDD and VSS. The power supply potentials VDD and VSS are supplied to an internal voltage generator circuit 124. The internal voltage generator circuit 124 generates various internal potentials used during operation of the device 100, for example, internal potential VCCP. The power supply terminals are also supplied with power supply potentials VDDQ. The power supply potentials VDDQ and VSS are supplied to the input/output circuit 122. The power supply potential VDDQ supplied to the power supply terminals may be the same potentials as the power supply potential VDD supplied to the power supply terminals in an embodiment of the disclosure. The power supply potential VDDQ supplied to the power supply terminals may be different potentials from the power supply potential VDD supplied to the power supply terminals in another embodiment of the disclosure. The power supply potentials VDDQ and VSS supplied to the power supply terminals are used for the input/output circuit 122 so that power supply noise generated by the input/output circuit 122 does not propagate to the other circuit blocks.

Figure 2:
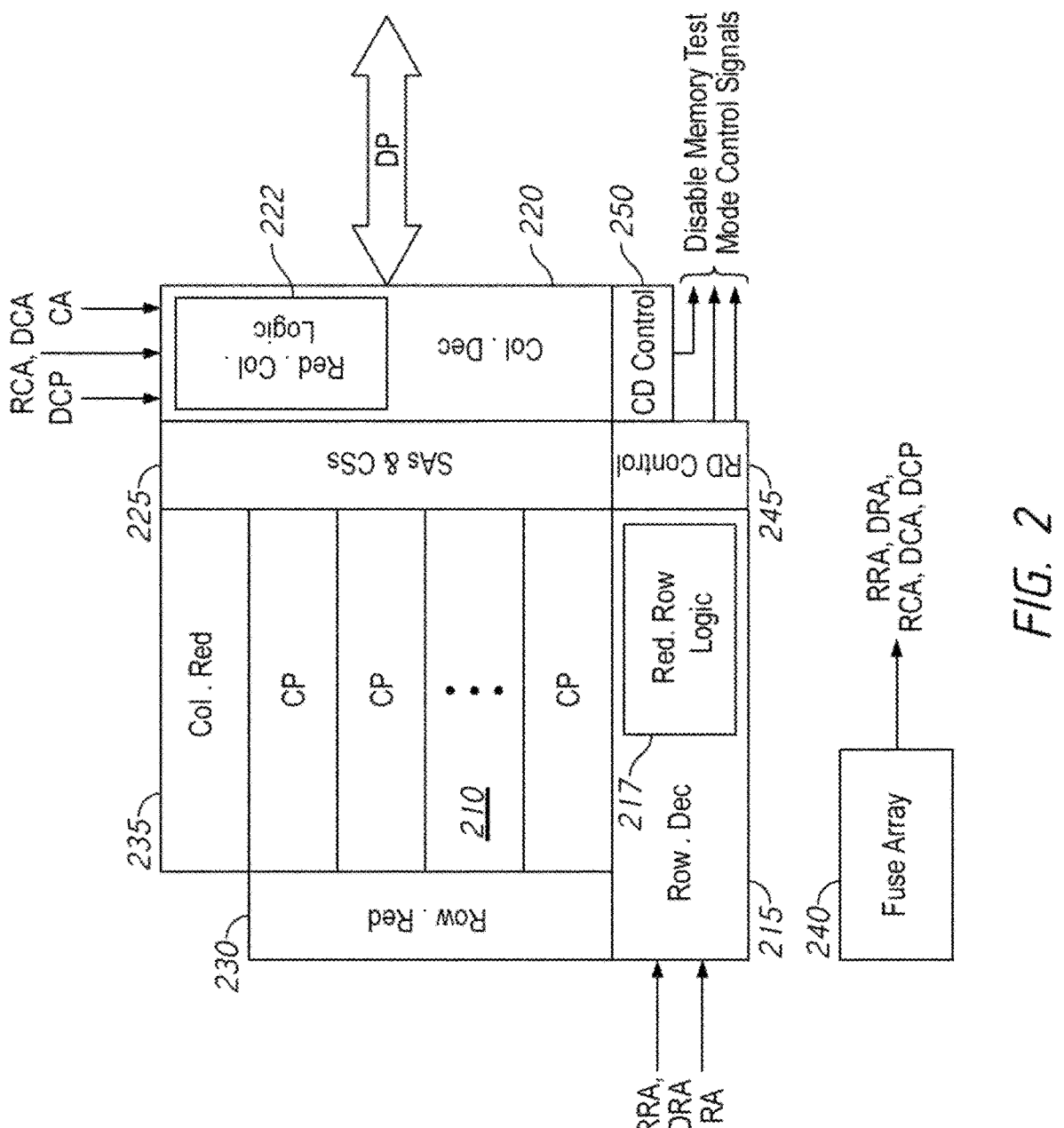
FIG. 2 is a portion of a semiconductor device according to some embodiments of the disclosure.

FIG. 2 is a portion of a semiconductor device according to some embodiments of the disclosure. A memory array 210 includes banks of memory, each having memory cells arranged is several column planes CP0-CPn. In some embodiments of the disclosure, the memory array 210 is included in the memory array 118 of FIG. 1. The memory cells are arranged along rows and columns in the column planes CP. Memory cells are accessed by activating one or more rows corresponding to a row address and selecting one or more columns corresponding to a column address to access the memory cell(s) at the intersection of the activated row and column. A row decoder 215 receives row addresses RA, decodes the row addresses RA and activates the corresponding row. A column decoder 220 receives column addresses CA, decodes the column addresses and accesses the corresponding column.

Sense amplifiers and column select circuits 225 are coupled to the columns of the column planes CP and selectively activated by the column decoder 220 when accessing the columns corresponding to a column address. Data read from the memory array 210 is provided over the data path DP to data output circuits for the semiconductor device, and data written to the memory array 210 is provided over the data path DP from data input circuits.

Redundant row memory 230 may be used to "repair" defective rows of memory in the column planes CP. A defective row of memory is repaired by remapping the row address of the defective row of memory to one or more functional redundant row memory. The row addresses of the defective rows of memory are stored in a fuse array 240, and loaded into redundant row latch sets. The row latch sets may be included in redundant row logic circuits 217 that are included in the row decoder 215. Each row latch set includes latch circuits for latching the row address of a defective row of memory, and includes comparison logic circuits for comparing incoming row addresses RA with the latched row address and providing an active match signal when a match is detected between an incoming row address RA and the latched row address. Each row latch set corresponds to one or more redundant row memory. By loading a row address into a row latch set, the row address is remapped to the redundant row memory that corresponds to that row latch set. In operation, an incoming row address RA is compared by each row latch set to a respective loaded row address. If the incoming row address RA matches any of the row addresses loaded in the row latch sets, the redundant row memory corresponding to the latch set loaded with the matching row address is accessed, instead of the original (defective) row in the column planes CP.

Redundant column memory 235 may be used to "repair" defective columns of memory in the column planes CP. A defective column of memory is repaired by remapping the column address of the defective column of memory to one or more functional redundant column memory. The column addresses of the defective columns of memory are stored in the fuse array 240, and loaded into redundant column latch sets. The column latch sets may be included in redundant column logic circuits 222 that are included in the column decoder 220. Each column latch set includes latch circuits for latching the column address of a defective column of memory, and includes comparison logic circuits for comparing incoming column addresses CA with the latched column address and providing an active match signal when a match is detected between an incoming column address CA and the latched column address. Each column latch set corresponds to one or more redundant column memory. By loading a column address into a column latch set, the column address is remapped to the redundant column memory that corresponds to that column latch set. In operation, an incoming column address CA is compared by each column latch set to a respective loaded column address. If the incoming column address CA matches any of the column addresses loaded in the column latch sets, the redundant column memory corresponding to the latch set loaded with the matching column address is accessed, instead of the original (defective) column in the column planes CP.

The fuse array 240 may be programmed to store redundant row addresses RRA, which are the row addresses of defective rows of memory to be loaded into the row latch sets to be remapped to redundant row memory. The fuse array 240 may also be programmed to store redundant column addresses RCA, which are the column addresses of defective columns of memory to be loaded into the column latch sets to be remapped to redundant column memory. The redundant row addresses RRA and redundant column addresses RCA stored in the fuse array may be loaded into the row and column latch sets, for example, during initialization of the semiconductor device.

The fuse array 240 may also store disable row addresses DRA of one or more rows of memory that are forced to fail, for example, as part of memory testing or failure analysis. The fuse array may also store disable column addresses DCA of one or more columns of memory that are forced to fail, for example, as part of memory testing or failure analysis. The disable column addresses DCA may include a column address corresponding to the column(s) of memory forced to fail, and also include a column plane address of the column plane that includes the column of memory forced to fail. The fuse array may also store disable column plane addresses DCP corresponding to one or more column planes that are forced to fail, for example, as part of memory testing or failure analysis. The disable row addresses DRA are loaded into the redundant row latch sets, and the disable column addresses DCA are loaded into the redundant column latch sets. The disable column plane addresses DCP may be loaded into column plane latch sets that may be included in the redundant column logic.

Row disable control circuit 245 includes logic circuits that generate control signals to change access operations for memory based on the disable row addresses DRA loaded into one or more row latch sets and a disable memory test mode. A disable memory test mode may be selected by setting an error test mode code in a mode register of the semiconductor device, or programming fuses with the error test mode code. By changing access operations for the memory, a row(s) of memory, or portions of a row(s) of memory may be forced to fail, for example, the row(s) or portion of the row(s) corresponding to a disable row address DRA. Column disable control circuit 250 includes logic circuits that generate control signals to change access operations for memory based on the disable column addresses DCA loaded into one or more column latch sets and a disable memory test mode. A disable memory test mode may be selected by setting an error test mode code in the mode register of the semiconductor device, or programming fuses with the error test mode code. By changing access operations for the memory, a column(s) of memory, or portions of a column(s) of memory may be forced to fail, for example, the column(s) or portion of the column(s) corresponding to a disable column address DCA.

Figure 3:
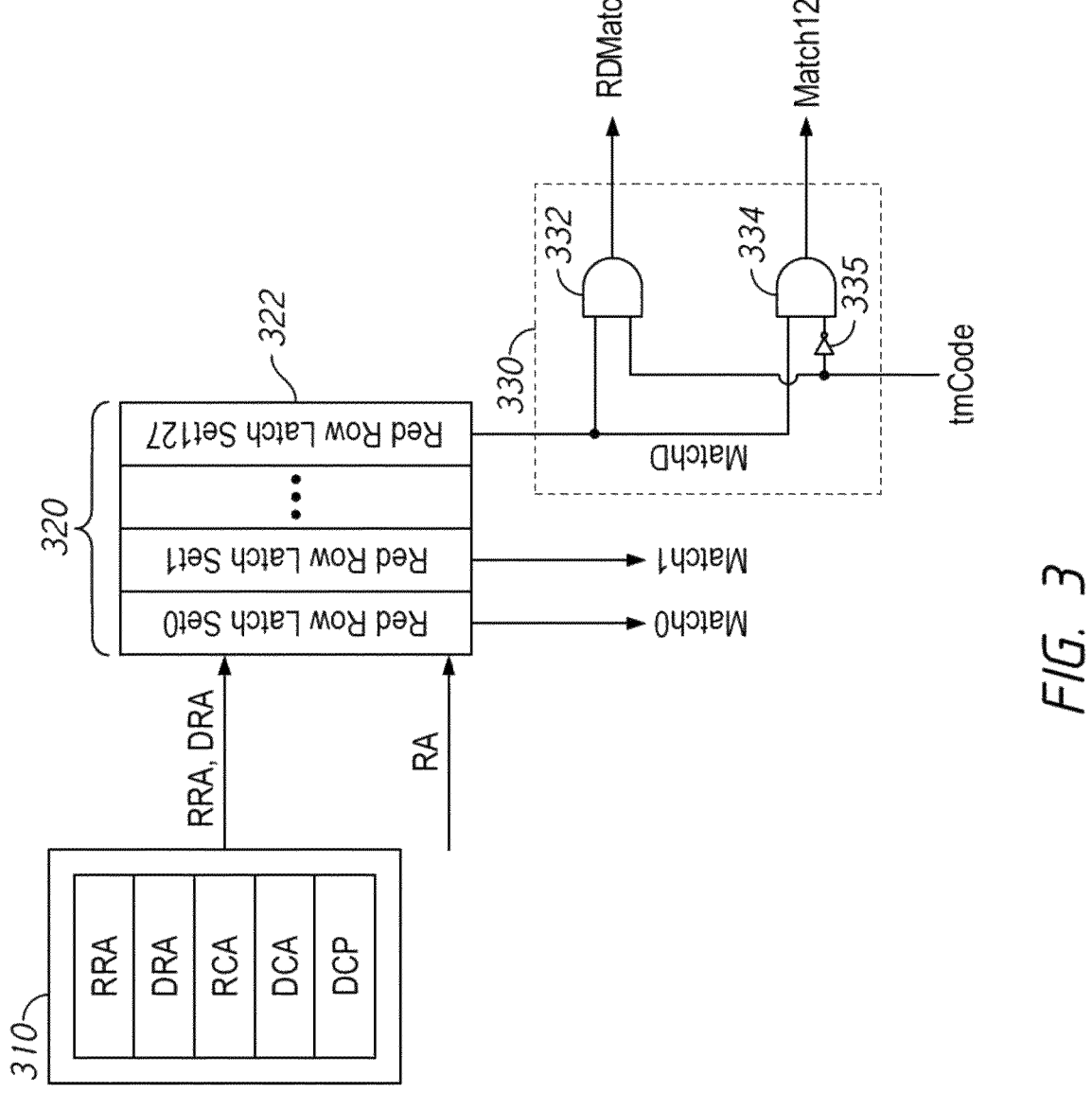
FIG. 3 is a diagram of a row disable control circuit according to an embodiment of the disclosure.

FIG. 3 is a diagram of a row disable control circuit 330 according to an embodiment of the disclosure. Additionally shown are fuse array 310 and row latch sets 320. In some embodiments of the disclosure, the disable control circuit 330 may be included in the row disable control circuit 245, the redundant row logic circuits 217, split between the row disable control circuit 245 and the redundant row logic circuits 217 of FIG. 2, or included elsewhere in a semiconductor device.

A fuse array 310 stores a number of repair addresses, including redundant row addresses RRA and redundant column addresses RCA. The fuse array 310 further stores a number of disable addresses, including disable row addresses DRA, disable column addresses DCA, and disable column plane addresses DCP. The addresses may be programmed into the fuse array 310 by changing the state (e.g., blowing) of one or more fuses. As previously described, the stored addresses are streamed out of the fuse array 310 and loaded into respective latch sets. For example, with reference to FIG. 3, repair addresses RRA are provided from the fuse array 310 and loaded into row latch sets 320. Additionally, one or more disable row addresses DRA may be provided from the fuse array 310 and loaded into one or more of the row latch sets 320. In some embodiments of the disclosure, one or more specific row latch sets may be set aside for storage of disable row addresses. In the example of FIG. 3, which show the row latch sets 320 as including 128 row latch sets, row latch set 322 is set aside for storing a disable row address. The row latch set 322 may be referred to as a disable row address latch set. The disable row address latch set 322 may be a final row latch set in some embodiments of the disclosure (e.g., the 128th row latch set of 128 row latch sets).

The row latch sets 320 each receive an incoming row address RA and provide a respective signal Match at an active level (e.g., active high logic level) if the incoming row address RA matches the redundant row address RRA stored in that row latch set. Each of the match signals may be associated with a respective redundant row of memory. An active Match signal indicates that that the associated respective redundant row of memory should be accessed responsive to the incoming row address RA. The disable row address latch set 322 provides a match signal MatchD. An active MatchD signal from the disable row address latch set 322 indicates that the incoming address RA matches a disable row address DRA stored by the disable row address latch set 322.

The MatchD signal of the disable row address latch set 322 is provided to the disable control circuit 330. The disable control circuit 330 includes an AND logic circuit 332 and an AND logic circuit 334. Both the AND logic circuits 332 and 334 are provided the MatchD signal of the disable row address latch set 322. The AND logic circuit 332 is provided disable memory test enable signal tmCode, and the AND logic circuit 332 is provided the complement of the disable memory test enable signal tmCode by inverter 335. The disable memory test enable signal tmCode is active (e.g., active high logic level) when a disable memory test mode is enabled, and is inactive (e.g., inactive low logic level) when the disable memory test mode is disabled. The disable memory test enable signal tmCode may be provided by disable memory test mode control logic (e.g., disable memory test mode control logic 107 of FIG. 1). The AND logic circuit 332 provides a row disable match signal RDMatch, and the AND logic circuit 334 provides a Match127 signal.

In operation, the AND logic circuit 332 provides an active row disable match signal RDMatch (e.g., active high logic level) when the disable memory test mode is enabled and the incoming address RA matches the disable row address DRA stored by the disable row address latch set 322 (e.g., the disable memory test enable signal tmCode is active and an active MatchD signal is provided by the disable row latch set 322). The AND logic circuit 332 otherwise provides an inactive row disable match signal RDMatch (e.g., inactive low logic level). The AND logic circuit 334 provides an inactive Match127 signal (e.g., inactive low logic level) regardless of the state of the MatchD signal when the disable memory test mode is enabled. The AND logic circuit 334 provides an active match signal Match127 (e.g., active high logic level) when the disable memory test mode is disabled and the incoming address RA matches the disable row address DRA stored by the disable row address latch set 322 (e.g., the disable memory test enable signal tmCode is inactive and an active MatchD signal is provided by the disable row latch set 322). In this manner, the disable row address latch set 322 may be used for normal operations when the disable memory test mode is disabled. The row disable match signal RDMatch provided by the disable control circuit 330 may be used to change access operations and cause errors related to memory corresponding to the disable row address DRA stored by the disable row address latch set 322. Forcing particular memory to fail in a controllable manner may be helpful in testing, evaluating, and performing failure analysis on the semiconductor device.

The row latch sets 320 includes at least the disable row address latch set 322. In some embodiments of the disclosure, the row latch set 320 includes additional disable row address latch sets for storing additional disable row addresses for forcing failures related to memory corresponding to the additional disable row addresses.

The repair and disable addresses stored in the fuse array 310 are stored in a persistent, non-volatile fashion. In other words, the repair and disable addresses remain stored even when the device is powered down. Row repair addresses and disable row addresses may be streamed out to row latch sets 320 as part of a power up of the memory. Accordingly, the disable row addresses programmed in the fuse array 310 may be persistent, and the memory associated with the disable row addresses DRA may continue to fail until that memory is repaired when the disable memory test enable signal tmCode is active. When a controller identifies the disable row address DRA as defective, the hPPR operation may include disabling the previous repair by changing the fuses which store the disable row address to indicate that "repair" should no longer be used, and reprogramming the address so that it is associated with a new row latch set and therefore a new redundant row of memory.

Figure 4:
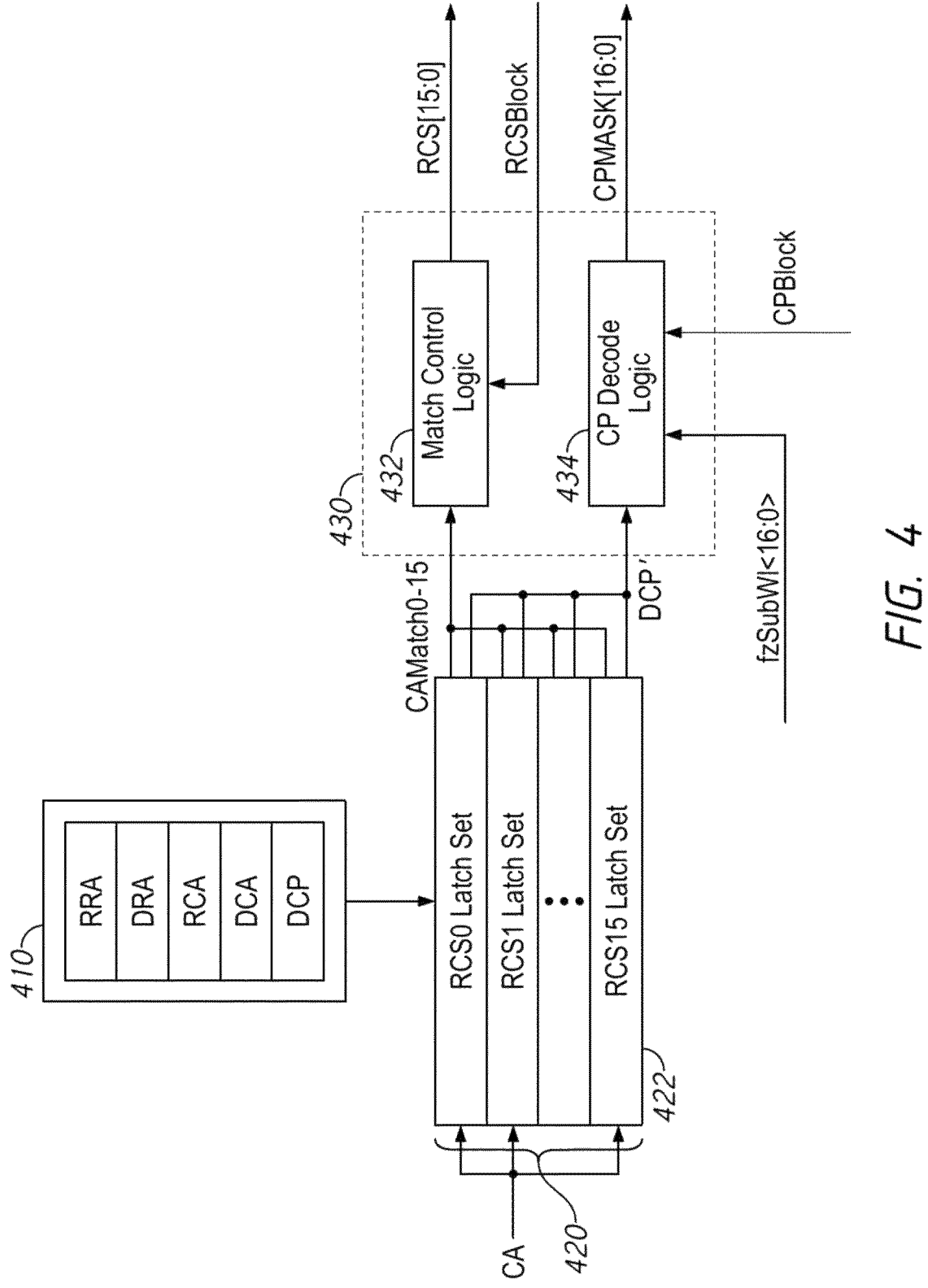
FIG. 4 is a diagram of a column disable control circuit according to an embodiment of the disclosure.

FIG. 4 is a diagram of a column disable control circuit 430 according to an embodiment of the disclosure. Additionally shown are fuse array 410 and column latch sets 420. In some embodiments of the disclosure, the disable control circuit 430 may be included in the column disable control circuit 250, the redundant column logic circuits 222, split between the column disable control circuit 250 and the redundant column logic circuits 222 of FIG. 2, or included elsewhere.

Similar to the fuse array 310 of FIG. 3, the fuse array 410 stores a number of repair addresses, including redundant row addresses RRA and redundant column addresses RCA. The fuse array 410 further stores a number of disable addresses, including disable row addresses DRA, disable column addresses DCA, and disable column plane addresses DCP. In some embodiments, the disable column address DCA includes an associated disable column plane address DCP. The addresses may be programmed into the fuse array 410 by changing the state (e.g., blowing) one or more fuses. In some embodiments of the disclosure, the fuse array 310 and 410 are a common fuse array that stores and provides the repair addresses RRA and RCA, and the disable addresses DRA, DCA, and DCP.

The stored addresses are streamed out of the fuse array 410 and loaded into respective latch sets. For example, with reference to FIG. 4, repair addresses RCA are provided from the fuse array 410 and loaded into column latch sets 420. One or more disable column addresses DCA may also be provided from the fuse array 410 and loaded into one or more of the column latch sets 420. Additionally, one or more disable column plane addresses DCP may also be provided from the fuse array 410 and loaded into one or more of the column latch sets 420. A disable column plane address DCP may be associated with a disable column address DCA, for example, identifying the column plane including the column of memory corresponding to the disable column address DCA. In some embodiments of the disclosure, a disable column address DCA and an associated disable column plane address DCP are stored together in a common column latch set 420. In some embodiments of the disclosure, one or more specific column latch sets may be set aside for storage of disable column addresses. In the example of FIG. 4, which show the column latch sets 420 as including 16 column latch sets, column latch set 422 is set aside for storing a disable column address and/or associated disable column plane address. The column latch set 422 may be referred to as a disable column address latch set. The disable column address latch set 422 may be a final column latch set in some embodiments of the disclosure (e.g., the $16^{th}$ column latch set of 16 column latch sets).

The column latch sets 420 each receive an incoming column address CA and provide a respective column address match signal CAMatch and further provide a respective associated column plane address DCP'. The respective associated column plane address DCP' may include one or more bits of information. The CAMatch signal is provided at an active level if the incoming column address CA matches the redundant column address RCA, and the associated column plane address DCP' stored in that column latch set is provided to the column disable control circuit 430. Each of the match signals may be associated with a respective redundant column of memory. An active match signal indicates that that the associated respective redundant column of memory should be accessed responsive to the incoming column address CA. The column plane address DCP' associated with the matching redundant column address identifies the column plane including the memory of the matching redundant column address. The disable column address latch set 422 provides a match signal CAMatch15 and associated column plane address DCP'. An active CAMatch15 signal from the disable column address latch set 422 indicates that the incoming address CA matches the disable column address DCA, and the associated disable column plane address DCP' stored in the disable column address latch set 422 is provided to the column disable control circuit 430.

Match signals CAMatch0-15 and column plane addresses DCP' of the disable column latch sets 420 are provided to the column disable control circuit 430. The column disable control circuit 430 includes match control logic circuit 432 and column plane CP decode logic circuit 434. The CAMatch0-15 signals are provided to the match control logic circuit 432, and the DCP' addresses are provided to the CP decode logic circuit 434. The match control logic circuit 432 also receives a disable memory test enable signal RCSBlock. The match control logic circuit 432 provides redundant column select signals RCS[14:0] based on the CAMatch0-14 signals, and provides redundant column select signal RCS[15] based on the CAMatch15 signal and the RCSBlock signal. The CP decode logic circuit 434 also receives a disable memory test enable signal CPBlock. The CP decode logic circuit 434 provides column plane control signals CPMask based on the DCP' addresses provided by the column latch sets 420 and the CPBlock signal. In some embodiments of the disclosure, the CPMask signal includes 17 bits, with each bit of the CPMask signal corresponding to one of 17 column planes. The disable memory test enable signals RCSBlock and CPBlock may be provided by disable memory test mode control logic (e.g., disable memory test mode control logic 107 of FIG. 1).

In operation, the match control logic circuit 432 provides an active RCS signal (e.g., active high logic level) when an active CAMatch signal is received from a corresponding column latch set. For example, an active RCS[0] signal is provided by the match control logic circuit 432 when it receives an active CAMatch0 signal from column latch set RCS0. Likewise, an active RCS[1] signal is provided by the match control logic circuit 432 when it receives an active CAMatch1 signal from column latch set RCS1. The match control logic circuit 432 provides an active RCS[15] signal when it receives an active CAMatch15 signal from column latch set RCS15 and the RCSBlock signal is inactive. However, when the RCSBlock signal is active, the match control logic circuit 432 provides an inactive RCS[15] signal even when it receives an active CAMatch signal from column latch set RCS15. The RCSBlock signal may be active when certain disable memory test modes are enabled, and the RCSBlock signal may be inactive when the certain disable memory test modes are not enabled. The RCS signals are used to activate column select circuits of redundant column memory corresponding to the particular column latch set to couple the redundant column memory to a data path. Also, the column select circuits for the original (failing) column of memory in the main array are disabled to prevent data collision on the data path between the original column of memory and the redundant column of memory. In this manner, the redundant column address RCA stored by the particular column latch set is remapped from column memory in the main array (which may be defective) to the redundant column memory corresponding to the particular column latch set.

The CP decode logic 434 decodes the DCP' addresses provided by the column latch sets 420 and provides the CPMask signal. An associated DCP' address is provided by a column latch set 420 when an incoming column address CA matches a redundant column address RCA stored by that particular column latch set. The DCP' address may include one or more bits of information, as previously described. For example, in some embodiments of the disclosure, the DCP' address includes 5-bits of information, and may be used to select one of 17 column planes of main memory. The associated CPMask signal provided by the CP decode logic 434 includes an active bit value (e.g., active "1") corresponding to the column plane of the matching column address CA. For example, when the incoming column address CA matches the redundant column address stored by the column latch set RCS0, the associated DCP' address also stored by the column latch set RCS0 is provided to the CP decode logic 434. The CP decode logic 434 provides the CPMask signal including a "1" corresponding to the column plane identified by the DCP' address from the column latch set RCS0. The CPMask signal for the other column planes remain inactive (e.g., inactive "0"). In an example, assuming the DCP' address indicates that column plane 3 includes the memory corresponding to the redundant column address stored in the column latch set RCS0, the CPMask signal provided by the CP decode logic 434 includes CPMask[3] =1, and CPMask[16:4]=0 and CPMask[2:0]=0. In another example, assuming the DCP' address indicates that column plane 7 includes the memory corresponding to the redundant column address stored in the column latch set RCS0, the CPMask signal provided by the CP decode logic 434 includes CPMask[7]=1, and CPMask[16:8]=0 and CPMask [6:0]=0.

An active bit of the CPMask signal may be used to block activation of column select circuits for the corresponding column plane. The CPMask signal may also be used to enable data multiplexing onto the data path, for example, data from the activated RCS is multiplexed onto the data path of the failing column plane. During routine access operations, blocking activation of the column select circuits of a column plane prevents data from that column plane (which includes the memory corresponding to the matching redundant column address, which may be defective) from being provided to a data path so that data from a redundant column of memory corresponding to one of the column latch sets 420 is provided to the data path instead.

Operation of the CP decode logic circuit 434 with regards to the DCP' address associated with the disable column address DCA stored by the column latch set RCS15 422 will now be described. The CP decode logic circuit 434 provides the CPMask signal having a "1" in the bit position for the column plane that includes memory corresponding to the disable column address DCA when (1) an incoming column address CA matches the disable column address DCA stored by the column latch set RCS15 422 and the associated DCP' address is provided to the CP decode logic 434, and (2) the CPBlock signal is inactive (e.g., inactive low logic level). As a result, activation of column select circuits for the column plane is blocked by the "1" in the CPMask signal to prevent data from that column plane from being provided to a data path.

However, the CP decode logic circuit 434 provides the CPMask signal having a "1" in the bit position for the column plane corresponding to the DCP' address stored by the column latch set RCS15 422 when (1) the CPBlock signal is active (e.g., active high logic level), and (2) an incoming row address RA matches a disable row address DRA (e.g., as previously described with reference to FIG. 3). In some embodiments of the disclosure, the CP decode logic circuit 434 provides the CPMask signal having a "1" in the bit position for the column plane that includes a sub-wordline identified by fuse information fzSubW1. The fuse information fzSubW1 may be programmed in the fuse array 410, and provided by the fuse array 410 to the CP decode logic 434. The fuse information fzSubW1 may include one or more bits. In some embodiments of the disclosure, the fuse information fzSubW1 may include 17-bits, with each bit corresponding to one of the (17) column planes. However, the fuse information fzSubW1 may include more or less bits in other embodiments of the disclosure.

The column disable control circuit 430 may be used to prevent proper access operations and cause errors related to memory corresponding to the disable column address DCA and associated DCP' address stored by the disable column address latch set 422. Forcing particular memory to fail in a controllable manner may be helpful in testing, evaluating, and performing failure analysis on the semiconductor device.

The column latch sets 420 includes at least the disable column address latch set 422. In some embodiments of the disclosure, the column latch sets 420 includes additional disable column address latch sets for storing additional disable column addresses and associated DCP' addresses for forcing failures related to memory corresponding to the additional disable column addresses and/or associated DCP' addresses.

The repair and disable addresses stored in the fuse array 410 are stored in a persistent, non-volatile fashion. In other words, the repair and disable addresses remain stored even when the device is powered down. Column repair addresses and disable column addresses may be streamed out to column latch sets 420 as part of a power up of the memory. Accordingly, the disable column addresses programmed in the fuse array 410 may be persistent, and the memory associated with the disable column addresses DCA may continue to fail until that memory is repaired. When a controller identifies the disable column address DCA as defective, the hPPR operation may include disabling the previous repair by changing the fuses which store the disable column address to indicate that "repair" should no longer be used, and reprogramming the address so that it is associated with a new column latch set and therefore a new redundant column of memory.

In some embodiments of the disclosure, the row disable control circuit 330 of FIG. 3 and the column disable control circuit 430 of FIG. 4 may be used separately or in combination to prevent proper access operations and cause errors related to memory corresponding to the disable row address DRA stored by the disable row latch set 322 and/or the column addresses DCA and associated DCP' address stored by the disable column address latch set 422.

Figure 5:
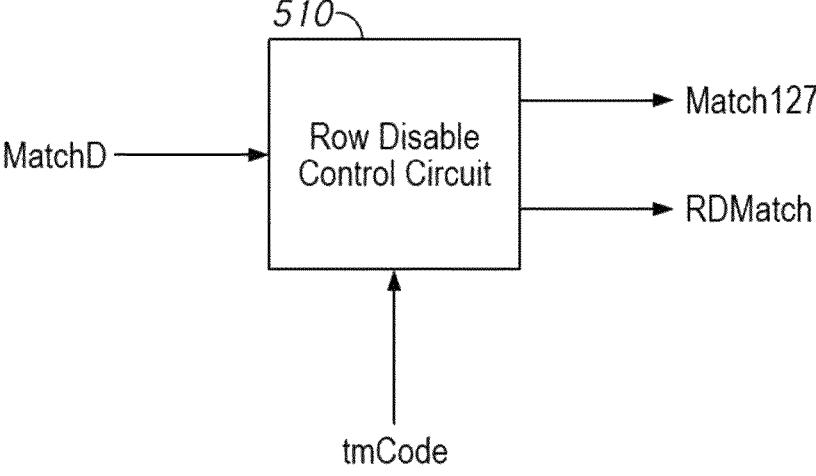
FIG. 5 is a block diagram of a row disable control circuit and row write circuits for causing failures along a full row of memory of a memory array according to an embodiment of the disclosure.
Figure 5:
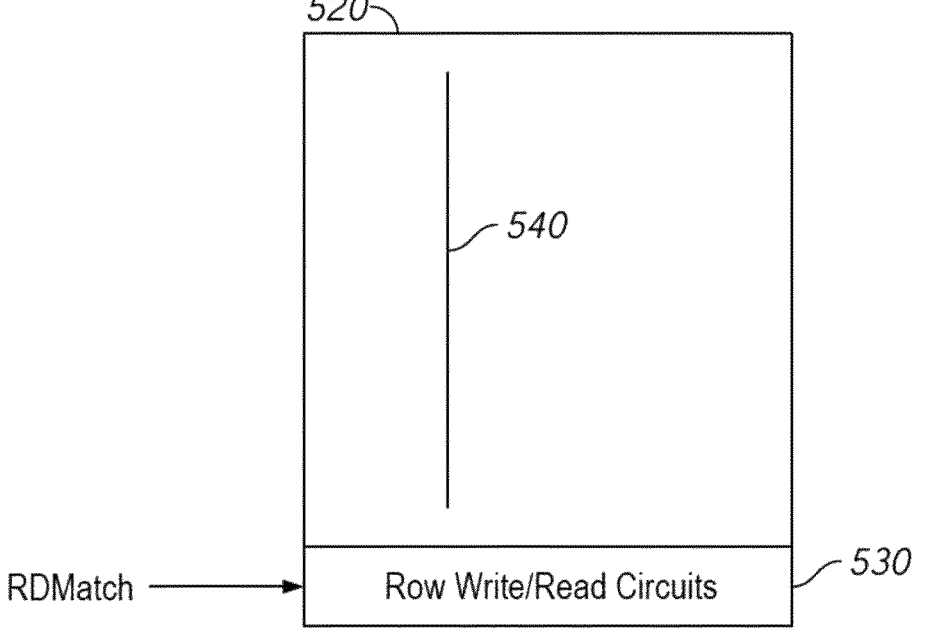

FIG. 5 is a block diagram of a row disable control circuit 510 and row write (and/or read) circuits 530 for causing failures along a full row of memory of a memory array 520 according to an embodiment of the disclosure. In some embodiments, the row disable control circuit 510 is included in the row disable control circuit 330 of FIG. 3.

A disable row address DRA is stored in a designated row latch set as previously described with reference to FIG. 3 (e.g., disable row address latch set). As also previously described, the disable row address DRA may be programmed in antifuses of a fuse array (e.g., fuse array 310 or 410) and then loaded into the designated row latch set. In some embodiments, the disable row address DRA may be additionally or alternatively loaded into the designated row address latch set using soft PPR circuits and/or a soft PPR operation. The disable row address latch set may be included in row latch sets, with the disable row address latch set providing a match signal (e.g., the MatchD signal from FIG. 322) to the row disable control circuit 510.

When an incoming row address RA matches the disable row address DRA, the designated row latch set provides an active MatchD signal. The row disable control circuit 510 provides an active match signal Match127 when the MatchD signal is active and the disable memory test enable signal tmCode is inactive. An inactive tmCode signal indicates that the disable memory test mode disabled, and as a result, the disable control circuit 510 operates the designated row latch set in a normal manner, that is, operating the designated row latch set as the other row latch sets 320.

In contrast, when the tmCode signal is active, indicating that the disable memory test mode is enabled, the row disable control circuit 510 provides an active row disable match signal RDMatch when an incoming row address RA matches the disable row address DRA (the designated row latch set provides an active MatchD signal). With the disable memory test mode enabled, the row of memory corresponding to the disable row address DRA (shown in FIG. 5 as row of memory 540) will be caused to fail when the incoming row address RA matches the disable row address DRA, which is indicated by the active row disable match signal RDMatch.

The active row disable match signal RDMatch may be used to alter the access operation to force a failure of the row of memory 540 corresponding to the disable row address stored by the designated row latch set. For example, in some embodiments of the disclosure, the RDMatch signal is provided to the row write/read circuits 530 to block a write operation to the entire row of memory 540 corresponding to the disable row address DRA.

The row write/read circuits 530 may be included in a row decoder, for example, row decoder 215 of FIG. 2. In some embodiments, write circuitry may be disabled by the active RDMatch signal when attempting to write to the row of memory 540 corresponding to the disable row address. In some embodiments, circuitry for activating the memory cells along the row of memory 540 corresponding to the disable row address may be blocked by the active RDMatch signal from activating the memory cells. In other embodiments, other circuitry for writing to the row of memory 540 corresponding to the disable row address may be blocked from normal operation to prevent writing expected data to the memory cells of the row of memory.

As a result, with the disable memory test mode enabled, data is not written to the row of memory 540 corresponding to the disable row address DRA. Reading data from the row of memory 540 corresponding to the disable row address DRA will result in errors due to the read data not matching expected data (which was blocked from being written to the row of memory). In some embodiments of the disclosure, read circuitry may be disabled by the active RDMatch signal when attempting to read from the row of memory 540 corresponding to the disable row address. As a result, with the disable memory test mode enabled, data is not read from the row of memory 540 corresponding to the disable row address DRA. Blocking the reading of data from the row of memory 540 corresponding to the disable row address DRA will result in errors due to the read data not matching expected data. The errors (from blocking a write operation and/or blocking a read operation) may be detected by a memory tester that tests the memory. Forcing a row of memory to fail (e.g., a row of memory corresponding to the disable row address DRA) may be helpful, for example, in evaluating performance of on-device test and repair circuits of the memory.

An example of using a column disable control circuit according to an embodiment of the disclosure, for example, column disable control circuit 430 of FIG. 4, to cause memory cells of a column of memory to fail is described with reference to FIGS. 6A and 6B, and FIG. 4.

Figure 6A:
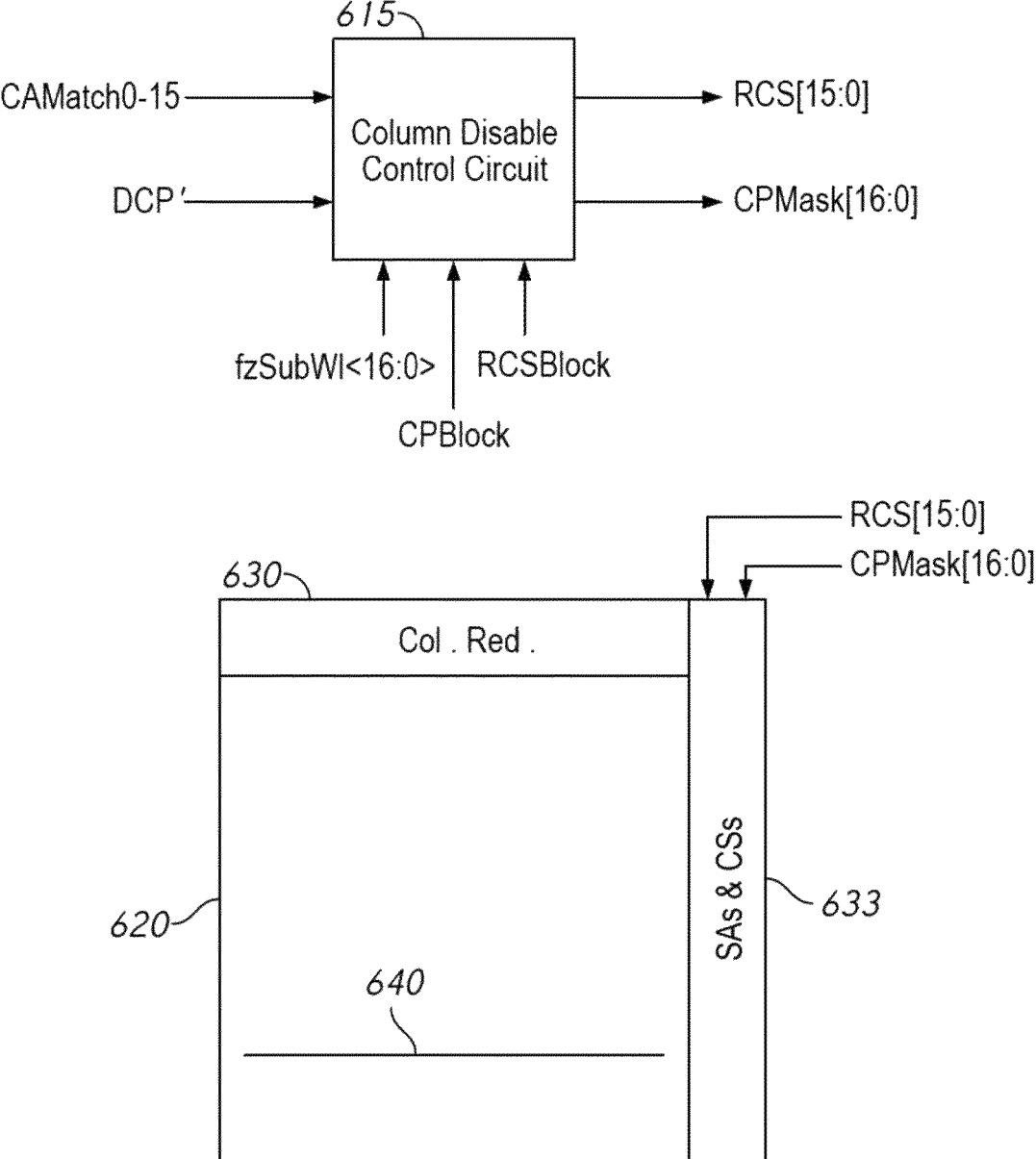
FIG. 6A is a block diagram of a column disable control circuit for causing failures along a column of memory of a memory array according to an embodiment of the disclosure.

FIG. 6A is a block diagram of a column disable control circuit 615 for causing failures along a column of memory of a memory array 620 according to an embodiment of the disclosure. In some embodiments, the column disable control circuit 615 is included in the column disable control circuit 430 of FIG. 4. The column disable control circuit 615 receives column address match signals CAMatch0-15, column plane addresses DCP', and further receives disable memory test enable signals RCSBlock, CPBlock, and/or fuse information fzSubW1<16:0>. The column disable control circuit 615 provides redundant column select signals RCS[15:0] and column plane control signals CPMask[16:0].

A disable column address DCA is stored in a designated column latch set as previously described with reference to FIGS. 3 and 4 (e.g., disable column address latch set). As also previously described, the disable column address may be programmed in antifuses of a fuse array (e.g., fuse array 310 or 410) and then loaded into the designated column latch set. In some embodiments, the disable column address DCA may be additionally or alternatively loaded into the designated column latch sets. The disable column address latch set may be included in column latch sets, with the disable column address latch set providing a column address match signal (e.g., the CAMatch15 from column latch set 422 of FIG. 4) to the column disable control circuit 615.

Figure 6B:
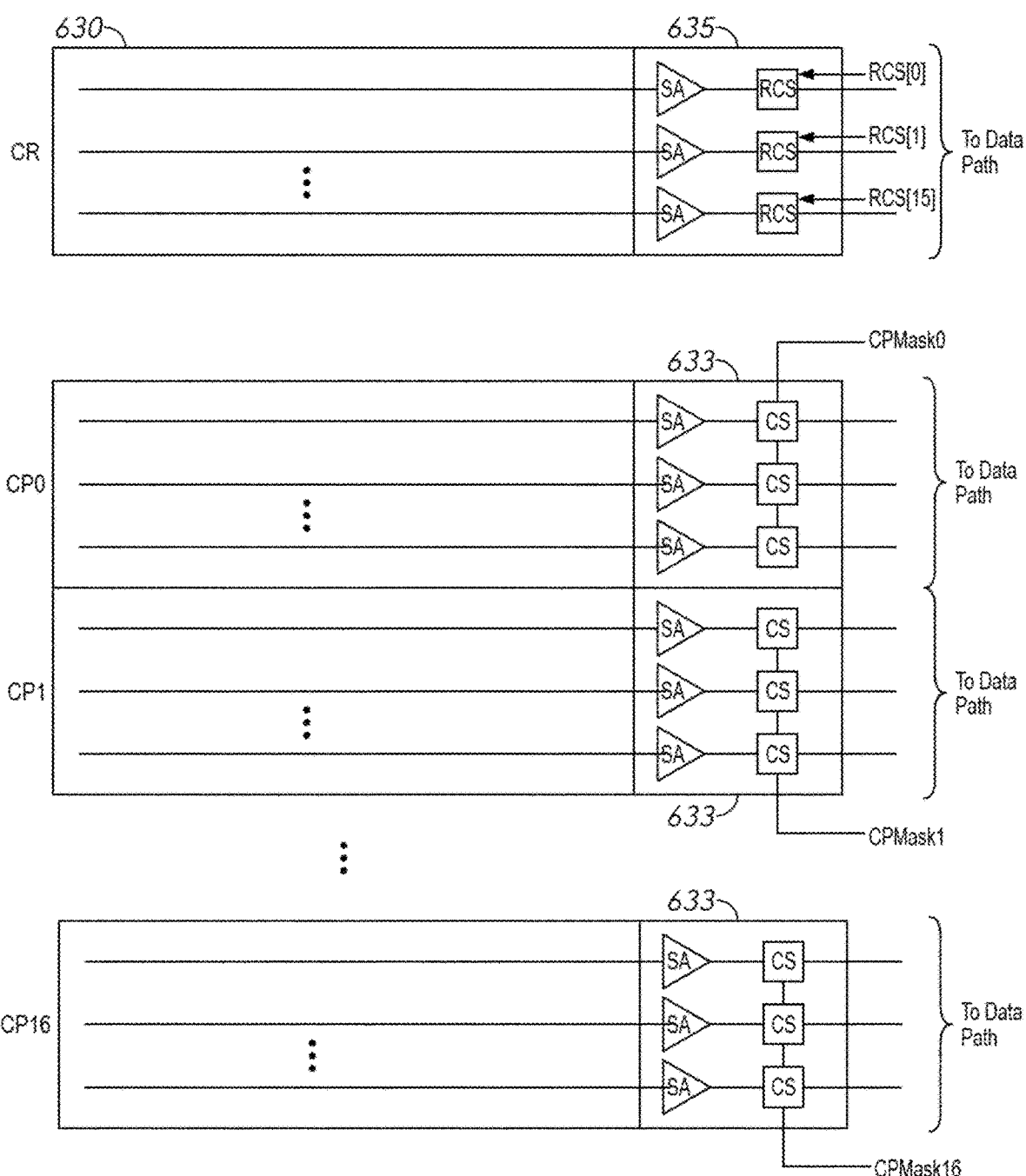
FIG. 6B is a block diagram of a portion of memory array according to an embodiment of the disclosure.

FIG. 6B is a block diagram of a portion of memory array 620 according to an embodiment of the disclosure. The memory array 620 may be included in the memory array 210 of FIG. 2 in some embodiments of the disclosure. The memory array 620 includes column planes CP0-CP16, and redundant column memory CR 630. The column planes CP0-CP16 include columns of memory. The columns of memory of each of the column planes CP0-CP16 of main memory are coupled to respective sets of sense amplifiers SA and column select circuits CS 633.

In a typical access operation, when memory cells are activated (e.g., corresponding to a row of memory), the activated memory cells are coupled to respective columns of memory. Data states of the activated memory cells are provided to the respective column of memory and amplified by the respective sense amplifier SA. A selected one or ones of the column select circuits are activated to provide the amplified data states to the data path. The column select circuits that are activated to provide the amplified data states to the data path are based on incoming column addresses CA. As previously described, incoming column addresses CA may include a column address. The column address information identifies the column select circuits to activate, except when the column address information corresponds to a defective column of memory that is repaired by a redundant column of memory.

The redundant column memory CR 630 includes redundant columns of memory. The redundant columns of memory are coupled to respective sets of sense amplifiers SA and redundant column select circuits RCS 635. In an access operation where one or more of the redundant columns of memory are accessed, for example, to repair defective columns of memory in the main memory array, when memory cells are activated (e.g., corresponding to the same row of memory activated for column planes CP0-CP16), the activated memory cells are coupled to respective redundant columns of memory. Data states of the activated memory cells are provided to the respective redundant column of memory and amplified by the respective sense amplifier SA. A selected one or ones of the redundant column select circuits are activated to provide the amplified data states to the data path. The redundant column select circuits may be activated, for example, by a respective redundant column select signal, such as a respective one of the redundant column select signals RCS[15:0] previously described.

Access operations to the memory array 620 will be described with reference to FIGS. 6A and 6B, and FIG. 4. However, access operations to the memory array 620 are not limited to operation with the circuits of these Figures.

For an access operation, incoming column addresses are compared to redundant column addresses RCA stored by the column latch sets 420 to determine whether an incoming column address has been mapped to redundant column of memory CR. When an incoming column address does not match any of the redundant column addresses RCA stored by the column latch sets 420, the column of memory in the main array corresponding to the incoming column address CA is accessed (e.g., a column of memory in one of the column planes CP0-CP16).

However, assuming that RCSBlock and CPBlock signals are both inactive, indicating that a disable memory test mode is disabled, when an incoming column address matches a redundant column address RCA stored by a column latch sets 420, the corresponding column latch set provides an active CAMatch signal to the match control logic circuit 432 and further provides an associated column plane address to the CP decode logic 434. The incoming column address matching a stored redundant column address RCA indicates that the column address is remapped to a redundant column of memory that corresponds to the column latch set that stores the column address that matches the incoming column address. In response to receiving the CAMatch0-15 signals, the match control logic circuit 432 provides inactive RCS signals, except for the RCS signal corresponding to the column address latch set that provided the active CAMatch signal. The active RCS signal activates the corresponding column select switch to provide data from the redundant column memory to the data path. Additionally, the CP decode logic 434 provides a CPMask signal to column select circuits of the sense amplifiers SA and column select circuits CS 633 having an active bit in the bit position corresponding to the column plane of the matching column address. The CPMask signal may also be provided to data multiplexing circuits coupled to the data path. The active bit for the CPMask signal disables the column select circuits for the column plane of main memory to prevent any data from the blocked column select circuits being provided to the data path. Thus, data from the defective column of memory in the main memory is blocked from being provided to the data path.

In a disable memory test mode for causing memory cells of a column of memory to fail, the disable memory test enable signal RCSBlock is active. In the present example, the RCSBlock signal is assumed to be active, and the CPBlock signal can either be active or inactive. With the RCSBlock signal active, which indicates a disable memory test mode for causing a column failure, the match control logic 432 provides an inactive redundant column select signal RCS[15] when an incoming address matches the disable column address DCA and associated disable column plane address DCP' stored by the disable column address latch set 422.

The inactive redundant column select signal RCS[15] may be used to cause a failure of the column of memory corresponding to the disable column address DCA and column plane address DCP' when the incoming column address CA matching the DCA and DCP is provided to the memory device. An example of a failing column of memory corresponding to the disable column address DCA and column plane address DCP is shown in FIG. 6A as column of memory 640. For example, while in the disable memory test mode (e.g., the disable memory test enable signal RCSBlock active), the inactive redundant column select signal RCS[15] prevents data from the redundant column of memory corresponding to the disable column address latch set 422 from being provided to the data path when an incoming column address CA matches the disable column address DCA stored in the disable column address latch set 422. As a result, no data is provided to the data path, that is, not from the column planes of the main array (because the active CPMask signal for the column plane associated with the disable column address DCA prevents data from being provided to the data path) and not from the column redundant memory CR 630 (because the inactive RCS[15] signal prevents the redundant column of memory corresponding to the disable column address latch set 422 from providing data to the data path). A tester will detect a failure for the column of memory 640 corresponding to the disable column address DCA. Predictably causing failures of columns of memory may be a useful tool in evaluating, and performing failure analysis on the semiconductor device. The previous description is related to read operations. For write operations, the inactive redundant column select signal RCS prevents data from being provided from the data path when an incoming column address CA matches the disable column address DCA stored in the disable column address latch set 422.

In some embodiments of the disclosure, the column redundant memory CR 630 is configured as global column redundancy GCR. With a GCR configuration, the redundant columns of memory are segmented. For example, the each of the redundant columns of memory may be segmented into four segments along the length of the column. Each of the segments of each redundant column of memory may be used to replace defective columns of memory or portions of defective columns of memory in the main array. In the embodiments of the disclosure including a global column redundancy GCR configuration, segments of redundant columns of memory may be caused to fail, rather than entire columns of memory as for the previously described disable memory test mode. The failing segment corresponds to the segment of redundant column of memory associated with the disable column address latch set 422 storing the disable column address DCA and associated disable column plane address DCP.

An example of using a row disable control circuit and a column disable control circuit according to an embodiment of the disclosure, for example, row disable control circuit 330 of FIG. 3 and column disable control circuit 430 of FIG. 4, to cause memory cells at an row and column intersection to fail is described with reference to FIG. 7.

Figure 7:
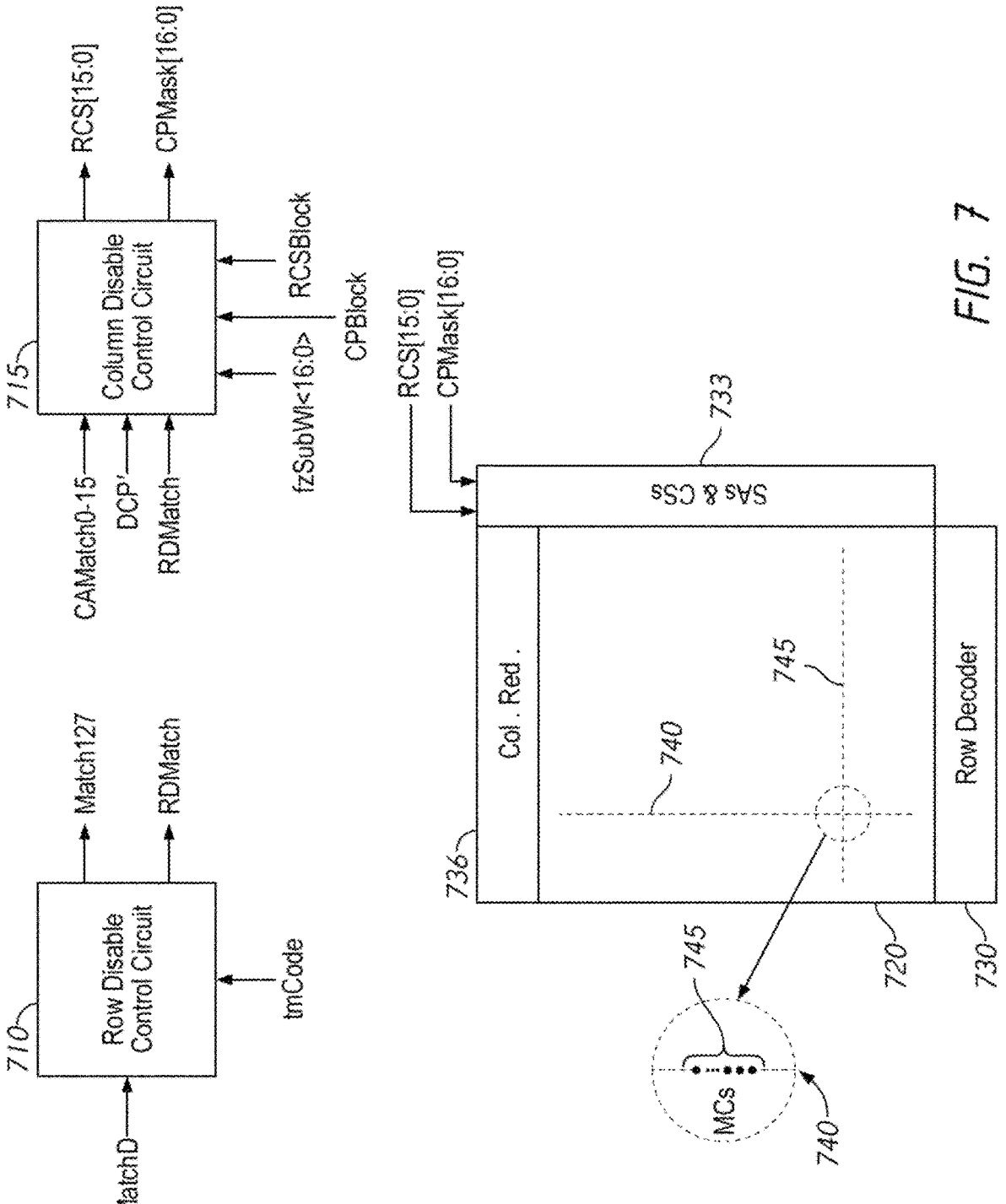
FIG. 7 is a block diagram of a row disable control circuit and a column disable control circuit for causing failures at an intersection of a row of memory and a column of memory of a memory array according to an embodiment of the disclosure.

FIG. 7 is a block diagram of a row disable control circuit 710 and a column disable control circuit 715 for causing failures at an intersection of a row of memory and a column of memory of a memory array 720 according to an embodiment of the disclosure. In some embodiments, the row disable control circuit 710 is included in the row disable control circuit 330 of FIG. 3 and/or the column disable control circuit 715 is included in the column disable control circuit 430 of FIG. 4 is included.

A disable row address DRA and a disable column address DCA are stored in a designated row latch set and designated column latch set as previously described with reference to FIGS. 3 and 4 (e.g., disable row address latch set and disable column address latch set). As also previously described, the disable row address DRA and the disable column address may be programmed in antifuses of a fuse array (e.g., fuse array 310 or 410) and then loaded into the designated row latch set and column latch set. In some embodiments, the disable row address DRA and the disable column address DCA may be additionally or alternatively loaded into the designated row and column latch sets using soft PPR circuits and/or a soft PPR operation. The disable row address latch set may be included in row latch sets, with the disable row address latch set providing a match signal (e.g., the MatchD signal from row latch set 322 of FIG. 3) to the row disable control circuit 710. The disable column address latch set may be included in column latch sets, with the disable column address latch set providing a column address match signal (e.g., the CAMatch15 from column latch set 422 of FIG. 4) to the column disable control circuit 715.

For the disable memory test mode for causing failures at an intersection of a row of memory and a column of memory of a memory array, the tmCode signal is active, and the RCSBlock signal is active when the row match signal MatchD is active, which indicates that an incoming row address RA matches the disable row address DRA. A row of memory 740 in the main memory array is shown in FIG. 7, which corresponds to the disable row address DRA. The row disable control circuit 710 provides an active row disable match signal RDMatch when the designated row latch set provides an active MatchD signal. The Match127 signal remains inactive because the disable memory test mode is enabled. The active row disable match signal RDMatch is provided to the column disable control circuit 715. A row decoder 730 accesses the row of memory corresponding to the incoming row address RA, which in the present example, corresponds to the row of memory 740.

The column disable control circuit 715 additionally receives column address match signals CAMatch0-15, column plane addresses DCP', and disable memory test enable signals RCSBlock, CPBlock, and/or fuse information fzSubW1<16:0>. The column disable control circuit 715 provides redundant column select signals RCS[15:0] and column plane control signals CPMask[16:0].

When an incoming column address CA matches the disable column address DCA, the disable column address latch set 422 provides an active CAMatch15 signal and provides the associated column plane address DCP' to the column disable control circuit 715. A column of memory 745 in the main memory array is shown in FIG. 7, which corresponds to the disable column address DCA. With the CAMatch15 signal active and associated column plane address DCP' provided to the column disable control circuit 715, and additionally with the RCSBlock signal active and the RDMatch signal active (indicating the disable memory test mode is enabled, and that an incoming row address RA matches the disable row address DRA), the column disable control circuit 715 provides an inactive RCS[15] signal and active CPMask signal corresponding to the associated column plane address DCP' to the sense amplifiers and column select circuits 733. As a result, the column select circuit for the redundant column of memory corresponding to the column latch set 422 is not activated and the column select circuits for the column plane corresponding to the associated column plane address DCP' are also not activated. Consequently, no data is provided from the redundant column memory 736 to the data path and no data is provided to the data path from the column of memory 745 in the column plane (of the main array) corresponding to the associated column plane address DCP'.

With no data provided to the data path from the access operation, a tester will detect a failure for the memory cell(s) 745 at the intersection of the row and columns of memory corresponding to the disable row address DRA and the disable column address DCA. One or more memory cells may be associated with accessing a column of memory. For example, as shown in FIG. 7, a plurality of memory cells along may be associated with accessing a column of memory 745 corresponding to a column address. The plurality of memory cells may be adjacent along a row of memory. In such embodiments, causing a failure at the intersection of a row and column of memory corresponding to the disable row address DRA and the disable column address DCA results in a memory tester detecting multiple failing memory cells along the row of memory. In some embodiments, eight memory cells along the row of memory at the intersection of the row and column of memory.

Figure 8:
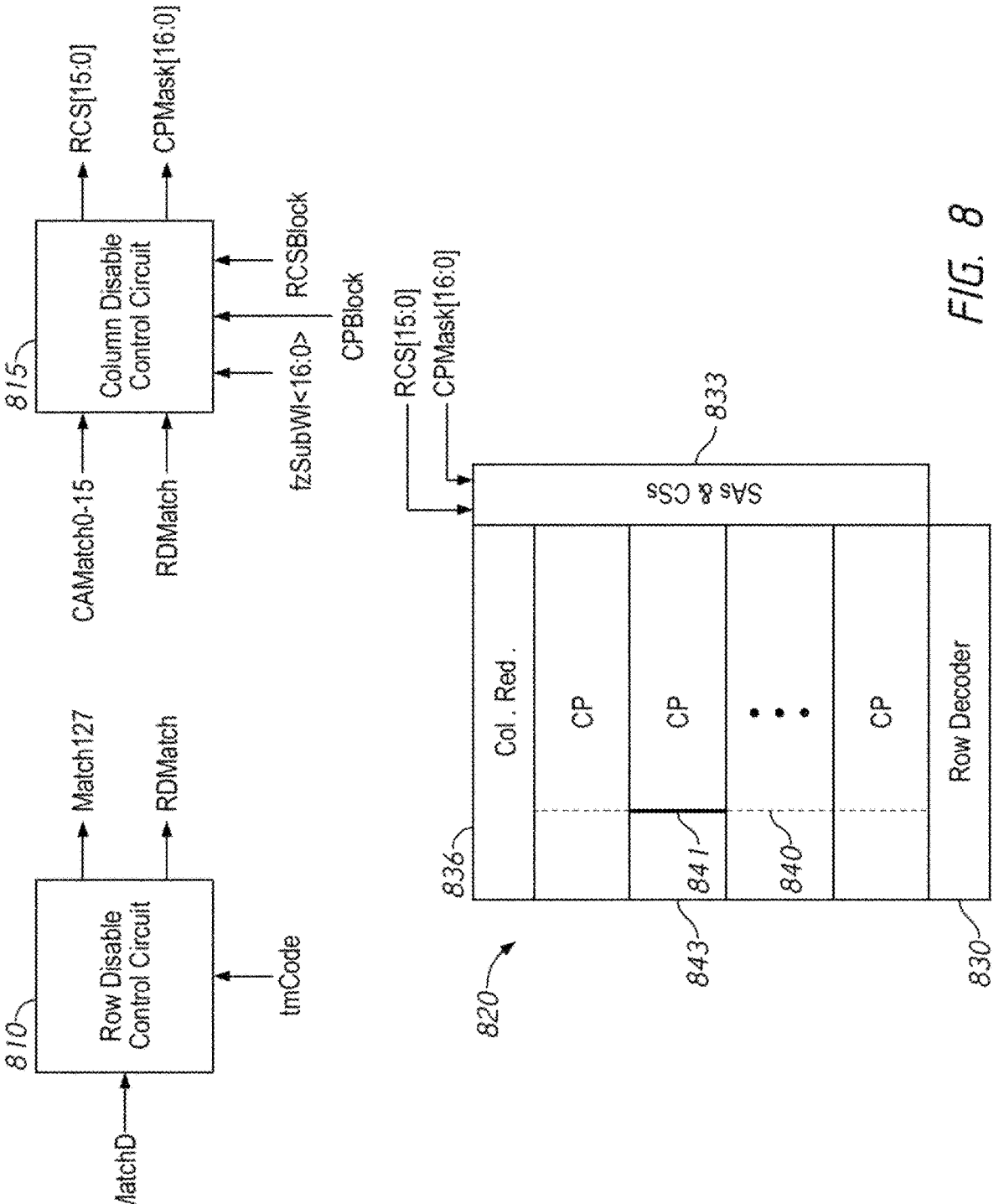
FIG. 8 is a block diagram of a row disable control circuit and a column disable control circuit for causing failures along a sub-wordline of a row of memory of a memory array according to an embodiment of the disclosure.

FIG. 8 is a block diagram of a row disable control circuit 810 and a column disable control circuit 815 for causing failures along a sub-wordline of a row of memory of a memory array 820 according to an embodiment of the disclosure. In some embodiments, the row disable control circuit 810 is included in the row disable control circuit 330 of FIG. 3 and/or the column disable control circuit 815 is included in the column disable control circuit 430 of FIG. 4.

A disable row address DRA and a disable column address DCA are stored in a designated row latch set and designated column latch set as previously described with reference to FIGS. 3 and 4 (e.g., disable row address latch set and disable column address latch set). As also previously described, the disable row address DRA and the disable column address may be programmed in antifuses of a fuse array (e.g., fuse array 310 or 410) and then loaded into the designated row latch set and column latch set. In some embodiments, the disable row address DRA and the disable column address DCA may be additionally or alternatively loaded into the designated row and column latch sets using soft PPR circuits and/or a soft PPR operation. The disable row address latch set may be included in row latch sets, with the disable row address latch set providing a match signal (e.g., the MatchD signal from row latch set 322 of FIG. 3) to the row disable control circuit 810. The disable column address latch set may be included in column latch sets, with the disable column address latch set providing a column address match signal (e.g., the CAMatch15 from column latch set 422 of FIG. 4) to the column disable control circuit 815.

For the disable memory test mode for causing failures along a sub-wordline of a row of memory of a memory array, the tmCode signal is active, and additionally the CPBlock signal is active when the row match signal MatchD is active, which indicates that an incoming row address RA matches the disable row address DRA. A row of memory 840 in the main memory array is shown in FIG. 8, which corresponds to the disable row address DRA. The row disable control circuit 810 provides an active row disable match signal RDMatch when the designated row latch set provides an active MatchD signal. The Match127 signal remains inactive because the disable memory test mode is enabled. The active row disable match signal RDMatch is provided to the column disable control circuit 815. A row decoder 830 accesses the row of memory corresponding to the incoming row address RA, which in the present example, corresponds to the row or memory 840.

The column disable control circuit 815 additionally receives column address match signals CAMatch0-15, column plane addresses DCP', and disable memory test enable signal RCSBlock, and/or fuse information fzSubW1<16:0>. The column disable control circuit 815 provides redundant column select signals RCS[15:0] and column plane control signals CPMask[16:0].

In the disable memory test mode for causing sub-wordline failures, when an incoming row address RA matches the disable row address DRA, the RDMatch signal is active and the CPBlock signal is active so that the column disable control circuit 815 receives a column plane address, which may be represented by fuse information fzSubW1<16:0> provided to the column disable control circuit 815. For example, the fuse information fzSubW1<16:0> identifies a column plane including a sub-wordline that is caused to fail. The column disable control circuit 815 provides an active CPMask signal corresponding to the fuse information fzSubW1<16:0> to column select circuit of the sense amplifiers and column select circuits 833 for the memory array 820, which includes the column planes CP and redundant column memory 836. The column plane corresponding to the fuse information fzSubW1<16:0> is shown in FIG. 8 as column plane 843.

As a result, for column addresses included in the column plane corresponding to the fuse information fzSubW1<16:0> that are along the row of memory corresponding to the disable row address DRA (e.g., row of memory 840), the active CPMask signal causes the column select circuits for the column plane 843 corresponding to the fuse information fzSubW1<16:0> to not be activated. With no data provided to the data path from the columns of memory included in the column plane 843 corresponding to the fuse information fzSubW1<16:0> that are along the row of memory 843 corresponding to the disable row address DRA, a tester will detect failures for the memory cell(s) along a sub-wordline 841 of the row of memory 840. The sub-wordline 841 extends across the column plane 842 corresponding to the fuse information fzSubW1<16:0>.

In some embodiments, in the disable memory test mode for causing sub-wordline failures, when an incoming row address RA matches the disable row address DRA, the RDMatch signal is active and the CPBlock signal is active so that the column disable control circuit 815 receives the column plane address DCP' of the disable column address DCA that is stored in the column latch set 422, and provides an active CPMask signal corresponding to the associated column plane address DCP' to the sense amplifiers and column select circuits 833 for the memory array 820, which includes the column planes CP and redundant column memory 836. The column plane corresponding to the column plane address DCP' is shown in FIG. 8 as column plane 843.

As a result, for column addresses included in the column plane corresponding to the associated column plane address DCP' that are along the row of memory corresponding to the disable row address DRA (e.g., row of memory 840), the active CPMask signal causes the column select circuits for the column plane 843 corresponding to the associated column plane address DCP' to not be activated. With no data provided to the data path from the columns of memory included in the column plane 843 corresponding to DCP' that are along the row of memory 843 corresponding to the disable row address DRA, a tester will detect failures for the memory cell(s) along a sub-wordline 841 of the row of memory 840. The sub-wordline 841 extends across the column plane 842 corresponding to the associated column plane address DCP'.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a fuse array configured to store a plurality of column repair addresses and respective associated column plane addresses;
redundant column memory including a plurality of redundant columns of memory;
a plurality of column latch sets coupled to the fuse array, each column latch set of the plurality of column latch sets corresponding to a respective one of the plurality of redundant columns of memory, each column latch set of the plurality of column latch sets configured to store a respective column repair address and associated column plane address, and when an incoming column address matches the respective stored column repair address, to provide a respective match signal and the associated column plane address; and a column disable control circuit coupled to the plurality of column latch sets to receive the respective match signals and the associated column plane addresses, the column disable control circuit configured to provide redundant column select signals and column plane masking signals based on the respective match signals and associated column plane addresses, the column disable control circuit further configured to provide an active redundant column select signal and an active column plane masking signal corresponding to an active match signal and associated column plane address, and to provide an inactive redundant column select signal corresponding to an active match signal of a designated column latch set of the plurality of column latch sets when a disable memory test mode is enabled.

2. The apparatus of claim 1, further comprising:

a memory array including the redundant column memory and further including a plurality of columns of main memory;

a first plurality of sense amplifiers and column select circuits coupled to the plurality of columns of main memory and configured to receive the column plane masking signals; and a second plurality of sense amplifiers and column select circuits coupled to the redundant column memory, the second plurality of sense amplifiers and column select circuits configured to receive the redundant column select signals, and further configured to activate a column select circuit of the second plurality of sense amplifiers and column select circuits when a respective redundant column select signal is active and to not activate the column select circuit of the second plurality of sense amplifiers and column select circuits when the respective redundant column select signal is inactive while the disable memory test mode is enabled to cause a column of memory of the main memory to fail.

3. The apparatus of claim 2 wherein the redundant column memory comprises global column redundancy, the global column redundancy include a plurality of segmented columns of redundant memory, and segments of a column of memory of the main memory are caused to fail by the column select circuit of the second plurality of sense amplifiers and column select circuits not being activated when the respective redundant column select signal is inactive while the disable memory test mode is enabled.

4. The apparatus of claim 1 wherein the fuse array is further configured to store a plurality of row repair addresses, the apparatus further comprising:

redundant row memory including a plurality of redundant rows of memory;

a plurality of row latch sets coupled to the fuse array, each row latch set of the plurality of row latch sets corresponding to a respective one of the plurality of redundant rows of memory, each row latch set of the plurality of row latch sets configured to store a respective row repair address, and when an incoming row address matches the respective stored row repair address, to provide a respective row match signal; and a row disable control circuit coupled to the plurality of row latch sets to receive the respective row match signals, the row disable control circuit configured to provide a redundant match signal and a row disable match signal, the row disable control circuit configured to provide an active redundant match signal and inactive row disable match signal when a designated one of the plurality of row latch sets provides an active row match signal, and further configured to provide an inactive redundant match signal and an active row disable match signal when the designated one of the plurality of row latch sets provides the active row match signal and the disable memory test mode is enabled.

5. The apparatus of claim 4, further comprising:

a memory array including the redundant column memory, and further including a plurality of columns of main memory and a plurality of rows of main memory;

a row decoder configured to access a selected one of the plurality of rows of main memory corresponding to an incoming row address;

a first plurality of sense amplifiers and column select circuits coupled to the plurality of columns of main memory and configured to receive the column plane masking signals; and a second plurality of sense amplifiers and column select circuits coupled to the redundant column memory, wherein the column disable control circuit is configured to receive the row disable match signal, and the column disable control circuit is configured to provide the inactive redundant column select signal corresponding to an active match signal of a designated column latch set of the plurality of column latch sets when a disable memory test mode is enabled and the row disable match signal is active to cause one or more memory cells at an intersection of a row and column of main memory to fail.

6. The apparatus of claim 5 wherein eight memory cells at the intersection of the row and the column of main memory are caused fail by the column disable control circuit providing the inactive redundant column select signal corresponding to an active match signal of a designated column latch set of the plurality of column latch sets while the disable memory test mode is enabled and the row disable match signal is active.

7. The apparatus of claim 4, further comprising:

a memory array including a plurality of rows of main memory;

row write circuits coupled to the memory array and configured to activate memory cells along one or more rows of the plurality of rows of main memory to have data written thereto during an access operation, the row write circuits further configured to receive the row disable match signal and block a write operation to a row of memory when the row disable match signal is active to cause a row of the plurality of rows of main memory to fail.

8. The apparatus of claim 4, further comprising:

a memory array including a plurality of rows of main memory;

row read circuits coupled to the memory array and configured to activate memory cells along one or more rows of the plurality of rows of main memory to read data therefrom during an access operation, the row read circuits further configured to receive the row disable match signal and block a read operation for a row of memory when the row disable match signal is active to cause a row of the plurality of rows of main memory to fail.

9. The apparatus of claim 4 wherein the a row disable control circuit comprises:

a first AND logic circuit configured to receive the row match signal provided by the designated one of the plurality of row latch sets and to receive a disable memory test enable signal, and configured to provide the row disable match signal; and a second AND logic circuit configured to receive the row match signal provided by the designated one of the plurality of row latch sets and to receive an inverted disable memory test enable signal, and configured to provide the redundant match signal.

10. The apparatus of claim 4, further comprising:

a memory array including the redundant column memory, and further including a plurality of column planes having columns of main memory and a plurality of sub-wordlines corresponding to rows of main memory;

a row decoder configured to access a selected one of the plurality of rows of main memory corresponding to an incoming row address;

a first plurality of sense amplifiers and column select circuits coupled to the plurality of columns of main memory and configured to receive the column plane masking signals; and a second plurality of sense amplifiers and column select circuits coupled to the redundant column memory, wherein the column disable control circuit is configured to receive the row disable match signal, and the column disable control circuit is configured to provide the active column plane masking signal corresponding to a column plane of the memory array when a disable memory test mode is enabled and the row disable match signal is active to cause memory cells of a sub-wordline of main memory to fail.

11. The apparatus of claim 10 wherein the column plane of the memory array corresponding to the active column plane masking signal is identified by an associated column plane address stored by a designated column latch set of the plurality of column latch sets.

12. The apparatus of claim 10 wherein the column plane of the memory array corresponding to the active column plane masking signal is identified by fuse information provided to the column disable control circuit.

13. The apparatus of claim 1 wherein the column disable control circuit comprises:

match control logic configured to receive the respective match signals and provide the redundant column select signals based on the match signals and first disable memory test enable signal, the disable memory test enable signal active to enable the disable memory test mode; and column plane decode logic configured to receive the associated column plane addresses and decode the column plane addresses to provide corresponding column plane masking signals.

14. An apparatus, comprising:

a plurality of row latch sets, each row latch set of the plurality of row latch sets corresponding to a respective one of a plurality of redundant rows of memory, each row latch set of the plurality of row latch sets configured to store a respective row repair address, and when an incoming row address matches the respective stored row repair address, to provide a respective row match signal;

a row disable control circuit coupled to the plurality of row latch sets to receive the respective row match signals, the row disable control circuit configured to provide an active row disable match signal when a designated one of the plurality of row latch sets provides an active row match signal and the disable memory test mode is enabled;

a plurality of column latch sets, each column latch set of the plurality of column latch sets corresponding to a respective one of a plurality of redundant columns of memory, each column latch set of the plurality of column latch sets configured to store a respective column repair address and associated column plane address, and when an incoming column address matches the respective stored column repair address, to provide a respective column match signal and the associated column plane address; and a column disable control circuit coupled to the plurality of column latch sets to receive the respective column match signals and the associated column plane addresses, the column disable control circuit configured to provide a redundant column select signal that is inactive and an active column plane masking signal corresponding to an active match signal of a designated column latch set of the plurality of column latch sets when a disable memory test mode is enabled to cause a memory of main memory to fail.

15. The apparatus of claim 14, further comprising:

a plurality of sense amplifiers and column select circuits coupled to a plurality of columns of main memory and configured to receive the column plane masking signal and the redundant column select signal, wherein the column disable control circuit is configured to receive the row disable match signal, and the column disable control circuit is configured to provide the redundant column select signal as inactive corresponding to the active match signal of the designated column latch set of the plurality of column latch sets when the disable memory test mode is enabled and the row disable match signal is active to block data to or from the plurality of columns of main memory and to or from the redundant columns of memory to cause one or more memory cells at an intersection of a row and column of main memory to fail.

16. The apparatus of claim 14, further comprising:

a plurality of sense amplifiers and column select circuits coupled to a plurality of columns of main memory and configured to receive the column plane masking signal and the redundant column select signal, wherein the column disable control circuit is configured to receive the row disable match signal and fuse information identifying a column plane of main memory, and the column disable control circuit is configured to provide the active column plane masking signal for the column plane of main memory when the disable memory test mode is enabled and the row disable match signal is active to block data from being provided from the column plane of the main memory for the row of memory corresponding to the row address stored in the designated one of the plurality of row latch sets to cause memory cells of a sub-wordline of main memory to fail.

17. A method, comprising:

comparing an incoming column address to a column address and associated plane address stored in a designated column latch set;

activating a match signal provided by the designated column latch set when the incoming column address matches the column address stored in a designated column latch set; and providing from a column disable control circuit an active redundant column select signal and an active column plane masking signal responsive to the active match signal and a disable memory test mode is not enabled, and providing from the column disable control circuit an inactive redundant column select signal and the active column plane masking signal responsive to the active match signal and a disable memory test mode is enabled to force memory cells of a main memory array to fail.

18. The method of claim 17, further comprising:

when the redundant column select signal is inactive, not activating a redundant column select circuit of a redundant column of memory corresponding to the designated column latch set; and blocking data from being provided from a column of memory corresponding to the column address stored in the designated column latch set to cause the column of memory corresponding to the column address stored in the designated column latch set to fail.

19. The method of claim 17, further comprising:

comparing an incoming row address to a row address stored in a designated row latch set; and activating a row match signal provided by the designated row latch set when the incoming row address matches the row address stored in a designated row latch set;

activating a row disable match signal when the row match signal is activated and the disable memory test mode is enabled; and providing from the column disable control circuit the inactive redundant column select signal and active column plane masking signal when the row match signal is active, the disable memory test mode is enabled, and the row disable match signal is activated to cause one or more memory cells to fail at an intersection of a row of the main memory array corresponding to the row address stored in the designated row latch set and a column of the main memory array corresponding to the column address stored in the designated column latch set.

20. The method of claim 17, further comprising:

comparing an incoming row address to a row address stored in a designated row latch set; and activating a row match signal provided by the designated row latch set when the incoming row address matches the row address stored in a designated row latch set;

activating a row disable match signal when the row match signal is activated and the disable memory test mode is enabled; and providing from the column disable control circuit the inactive redundant column select signal and active column plane masking signal when the disable memory test mode is enabled and the row disable match signal is activated to cause one or more memory cells to fail along a sub-wordline of a row of the main memory array corresponding to the row address stored in the designated row latch set.

21. The method of claim 17, further comprising:

comparing an incoming row address to a row address stored in a designated row latch set; and activating a row match signal provided by the designated row latch set when the incoming row address matches the row address stored in a designated row latch set;

activating a row disable match signal when the row match signal is activated and the disable memory test mode is enabled; and blocking a write operation to a row of memory corresponding to the row address stored in the designated row latch when the row disable match signal is activated to cause a row of the main memory array to fail.

\* \* \* \* \*